US012218361B2

(12) United States Patent
Cui

(10) Patent No.: US 12,218,361 B2
(45) Date of Patent: Feb. 4, 2025

(54) FLEXIBLE BATTERY, CIRCUIT BOARD AND ELECTRONIC DEVICE

(71) Applicant: BOE Technology Group Co., Ltd., Beijing (CN)

(72) Inventor: Yue Cui, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/912,531

(22) PCT Filed: Jul. 22, 2021

(86) PCT No.: PCT/CN2021/107963
§ 371 (c)(1),
(2) Date: Sep. 19, 2022

(87) PCT Pub. No.: WO2023/000274
PCT Pub. Date: Jan. 26, 2023

(65) Prior Publication Data
US 2024/0213591 A1    Jun. 27, 2024

(51) Int. Cl.
H01M 50/136    (2021.01)
G01M 5/00    (2006.01)
(Continued)

(52) U.S. Cl.
CPC ....... *H01M 50/136* (2021.01); *G01M 5/0033* (2013.01); *G01M 5/0091* (2013.01);
(Continued)

(58) Field of Classification Search
CPC ... H05K 1/18; H05K 1/181–187; H01M 2/27; H01M 2/275; H01M 50/10;
(Continued)

(56) References Cited

U.S. PATENT DOCUMENTS 5,326,652 A * 7/1994 Lake ............... H01M 50/129
429/185
8,031,122 B2 * 10/2011 Jang ............... H01M 50/119
343/866
(Continued)

FOREIGN PATENT DOCUMENTS

CN    103824985 A    5/2014
CN    105304834 A    2/2016
(Continued)

OTHER PUBLICATIONS

International Search Report issued Apr. 19, 2022 in corresponding International Patent Application No. PCT/CN2021/107963 (with English translation), 4 pages.
(Continued)

*Primary Examiner* — Tuan T Dinh
(74) *Attorney, Agent, or Firm* — XSENSUS LLP

(57) ABSTRACT

The present disclosure provides a flexible battery, a circuit board and an electronic device, belonging to the technical field of batteries. The flexible battery of the present disclosure includes a flexible encapsulation structure, a plurality of battery cells and a crack detection wiring. The flexible encapsulation structure has a battery area and a peripheral area surrounding the battery area. The battery area includes a plurality of rigid areas and a plurality of bending areas alternately arranged along a first direction. The plurality of battery cells are arranged in a one-to-one correspondence with the plurality of rigid areas. In a corresponding rigid area, the battery cell is cladded in the flexible encapsulation structure. The crack detection wiring is located in the peripheral area and at least partially extends along the first direction. The crack detection wiring is cladded in the flexible encapsulation structure.

18 Claims, 11 Drawing Sheets

(51) Int. Cl.
  *H01M 50/204* (2021.01)
  *H01M 50/298* (2021.01)
  *H05K 1/18* (2006.01)

(52) U.S. Cl.
  CPC ....... *H01M 50/204* (2021.01); *H01M 50/298* (2021.01); *H05K 1/18* (2013.01); *H05K 2201/10037* (2013.01)

(58) Field of Classification Search
  CPC ............. H01M 50/105; H01M 50/136; H01M 50/204; H01M 50/256; H01M 50/298; G01M 5/0033; G01M 5/0091
  USPC ................. 361/749–750, 782–784, 795, 818
  See application file for complete search history.

(56) References Cited

U.S. PATENT DOCUMENTS

| | | | |
|---|---|---|---|
| 10,020,476 B2 | 7/2018 | Fan | |
| 2010/0081049 A1* | 4/2010 | Holl | H01M 4/0414 29/623.5 |
| 2012/0299555 A1* | 11/2012 | Tam | H01M 10/46 429/90 |
| 2013/0171490 A1 | 7/2013 | Rothkopf et al. | |
| 2015/0280186 A1 | 10/2015 | Fan | |
| 2016/0043359 A1* | 2/2016 | Miyake | H01M 50/119 429/163 |
| 2016/0183794 A1* | 6/2016 | Gannon | G01K 1/024 600/549 |
| 2016/0260944 A1 | 9/2016 | Heo | |
| 2016/0260945 A1 | 9/2016 | Rothkopf et al. | |
| 2017/0040582 A1* | 2/2017 | Kim | H01M 50/121 |
| 2019/0213935 A1* | 7/2019 | Jung | H10K 59/131 |
| 2020/0008299 A1* | 1/2020 | Tran | H05K 1/0386 |
| 2020/0035762 A1* | 1/2020 | Kim | H10K 59/124 |
| 2020/0175901 A1* | 6/2020 | Lee | G09G 3/006 |
| 2020/0194845 A1 | 6/2020 | Yamakaji et al. | |
| 2020/0243807 A1* | 7/2020 | Harutyunyan | H01M 50/136 |
| 2020/0358124 A1* | 11/2020 | El Baradai | H01M 50/538 |
| 2021/0075052 A1* | 3/2021 | Bao | H01M 10/0436 |

FOREIGN PATENT DOCUMENTS

| | | |
|---|---|---|
| CN | 103824985 B | 2/2017 |
| CN | 109103352 A | 12/2018 |
| CN | 209560899 U | 10/2019 |
| CN | 110672704 A | 1/2020 |
| CN | 111261966 A | 6/2020 |
| JP | 2020119755 A | 8/2020 |
| KR | 20160107058 A | 9/2016 |
| WO | 2013101316 A1 | 7/2013 |

OTHER PUBLICATIONS

Written Opinion issued Apr. 19, 2022 in corresponding International Patent Application No. PCT/CN2021/107963 (with English translation), 4 pages.

* cited by examiner

FLEXIBLE BATTERY, CIRCUIT BOARD AND ELECTRONIC DEVICE

CROSS REFERENCE

The present application is a U.S. National Stage of International Application No. PCT/CN2021/107963, filed on Jul. 22, 2021, the contents of all of which are incorporated herein by reference in their entireties for all purposes.

TECHNICAL FIELD

The present disclosure relates to the field of battery technology, and in particular, to a flexible battery, a circuit board and an electronic device.

BACKGROUND

The edge of the flexible battery is prone to generating micro-cracks due to bending, which will lead to invalid encapsulation of the flexible battery, and the flexible battery is prone to generating invalid problems such as liquid leakage and swelling. However, the size of the micro-crack is too small to be quickly observed by naked eyes.

It should be noted that the information disclosed in the above Background section is only for enhancement of understanding of the background of the present disclosure, and therefore may contain information that does not form the prior art that is already known to a person of ordinary skill in the art.

SUMMARY

The present disclosure provides a flexible battery, a circuit board and an electronic device.

According to a first aspect of the present disclosure, there is provided a flexible battery, including:
  a flexible encapsulation structure, having a battery area and a peripheral area surrounding the battery area, wherein the battery area includes a plurality of rigid areas and a plurality of bending areas alternately arranged along a first direction;
  a plurality of battery cells, arranged in a one-to-one correspondence with the plurality of rigid areas, wherein, in a corresponding rigid area, the battery cell is cladded in the flexible encapsulation structure; and
  a crack detection wiring, located in the peripheral area and at least partially extending along the first direction, wherein, the crack detection wiring is cladded in the flexible encapsulation structure.

According to an implementation of the present disclosure, the peripheral area includes a first peripheral area and a second peripheral area located at two sides of the battery area, both the first peripheral area and the second peripheral area extend along the first direction;
  the crack detection wiring includes a first sub detection wiring and a second sub detection wiring that are electrically connected to each other, the first sub detection wiring penetrates through the first peripheral area along the first direction, and the second sub detection wiring penetrates through the second peripheral area along the first direction.

According to an implementation of the present disclosure, the peripheral area further includes a third peripheral area, the third peripheral area connects the first peripheral area and the second peripheral area;

the crack detection wiring further includes a third sub detection wiring penetrating through the third peripheral area, and the third sub detection wiring connects the first sub detection wiring and the second sub detection wiring.

According to an implementation of the present disclosure, a thickness of the crack detection wiring is in a range of 0.3-1.5 microns.

According to an implementation of the present disclosure, a width of the crack detection wiring is in a range of 0.2-1.0 mm.

According to an implementation of the present disclosure, a distance between the crack detection wiring and an edge of the flexible encapsulation structure is in a range of 0.5-1.5 mm.

According to an implementation of the present disclosure, a material of the crack detection wiring is a metal material.

According to an implementation of the present disclosure, the flexible encapsulation structure includes a first flexible encapsulation layer and a second flexible encapsulation layer arranged in layers, the battery cells are arranged between the first flexible encapsulation layer and the second flexible encapsulation layer;
  the crack detection wiring is located in the first flexible encapsulation layer.

According to an implementation of the present disclosure, the battery cells are arranged on a side of the first flexible encapsulation layer and arranged at intervals along the first direction;
  the second flexible encapsulation layer includes a protruding portion covering the battery cell, and a recessed portion between adjacent battery cells.

According to an implementation of the present disclosure, an elastic modulus of the first flexible encapsulation layer is greater than that of the second flexible encapsulation layer.

According to an implementation of the present disclosure, the first flexible encapsulation layer is a steel-plastic film.

According to an implementation of the present disclosure, the second flexible encapsulation layer is an aluminum-plastic film.

According to an implementation of the present disclosure, along a direction away from the battery cell, the first flexible encapsulation layer includes a first heat sealing layer, a first adhesive layer, a first metal layer, a second adhesive layer and a first protective layer that are stacked in sequence;
  the crack detection wiring is sandwiched between the second adhesive layer and the first protective layer.

According to an implementation of the present disclosure, the flexible battery further includes a flexible conductive layer, the flexible conductive layer is at least partially cladded in the flexible encapsulation structure, and is electrically connected with each battery cell;
  the flexible conductive layer has a binding area outside the flexible encapsulation structure, the binding area has a crack detection pad electrically connected with the crack detection wiring.

According to a second aspect of the present disclosure, there is provided a circuit board, including:
  a resistance detection circuit, electrically connected with the crack detection wiring of the flexible battery described above, and configured to be able to detect a resistance of the crack detection wiring; and
  a bootstrap circuit, electrically connected with the crack detection wiring, and configured to receive a first voltage and output a second voltage to the crack detection wiring, wherein the second voltage is higher than the first voltage.

According to an implementation of the present disclosure, the bootstrap circuit includes a boost sub-circuit and a logic control sub-circuit;

the boost sub-circuit includes:
a first capacitor, having two ends connected to a first node and a second node respectively;
a first switch, having one end electrically connected to the first node, and another end used for applying a reference voltage;
a second switch, having one end electrically connected to the second node, and another end electrically connected to an input end;
a third switch, having one end electrically connected to the input end, and another end electrically connected to the first node;
a fourth switch, having one end electrically connected to the second node, and another end electrically connected to an output end; and
a second capacitor, having one end electrically connected to the output end, and another end used for applying the reference voltage,
wherein the logic control sub-circuit is configured to turn on the first switch and the second switch and turn off the third switch and the fourth switch during a charging stage, and the logic control sub-circuit is further configured to turn off the first switch and the second switch and turn on the third switch and the fourth switch during a discharging stage.

According to a third aspect of the present disclosure, there is provided an electronic device including the flexible batteries described above.

It should be noted that the above general description and the following detailed description are merely exemplary and exemplary and should not be construed as limiting of the present disclosure.

BRIEF DESCRIPTION OF THE DRAWINGS

The accompanying drawings, which are incorporated in and constitute a part of this specification, illustrate embodiments consistent with the disclosure and serve to explain the principles of the disclosure together with the description. The drawings in the following description are only some embodiments of the present disclosure For those of ordinary skill in the art, other drawings can also be obtained from these drawings without creative effort.

Figure 1:
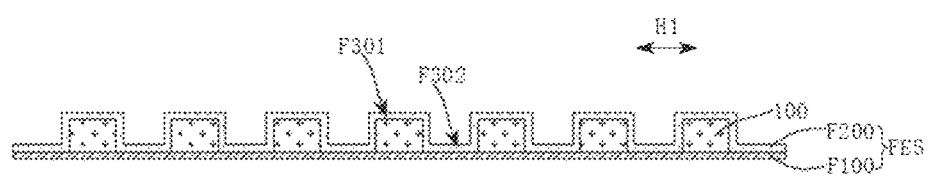
FIG. 1 is a schematic cross-sectional structural diagram of a flexible battery in an embodiment of the disclosure.

DESCRIPTION OF REFERENCE NUMBERS 100, battery cell; 101, battery cell body; 102, positive electrode tab; 103, negative electrode tab; 200, flexible conductive layer; 201, first flexible conductive band; 202, second flexible conductive band; FES, flexible encapsulation structure; F100, first flexible encapsulation layer; F200, second flexible encapsulation layer; F301, protruding portion; F302, recessed portion; F101, first heat sealing layer; F102, first adhesive layer; F103, first metal layer; F104, second adhesive layer; F105, first protective layer; F201, second heat sealing layer; F202, third adhesive layer; F203, second metal layer; F204, fourth adhesive layer; F205, second protective layer; AA, battery area; A1, rigid area; A2, bending area; BB, peripheral area; B1, first peripheral area; B2, second peripheral area; B3, third peripheral area; B4, fourth peripheral area; PCD, crack detection wiring; PCD1, first sub detection wiring; PCD2, second sub detection wiring; PCD3, third sub detection wiring; H1, first direction; H2, second direction.

DETAILED DESCRIPTION

Example embodiments will now be described more fully with reference to the accompanying drawings. Example embodiments, however, can be embodied in various forms and should not be construed as limited to the embodiments set forth herein. Rather, these embodiments are provided so that this disclosure will be thorough and complete, and will fully convey the concept of example embodiments to those skilled in the art. The same reference numerals in the drawings denote the same or similar structures, and thus their detailed descriptions will be omitted. Furthermore, the drawings are merely schematic illustrations of the present disclosure and are not necessarily drawn to scale.

Although relative terms such as "upper" and "lower" are used in this specification to describe the relative relationship of one component of an icon to another component, these terms are used in this specification only for convenience, for example according to the direction of the example described. It will be appreciated that if the device of the icon is turned upside down, the component described as "upper" will become the component described as "lower". When a certain structure is "on" other structures, it may mean that a certain structure is integrally formed on other structures, or that a certain structure is "directly" arranged on other structures, or that a certain structure is "indirectly" arranged on other structures through another structure.

The terms "a", "an", "the" and "at least one" are used to indicate the presence of one or more elements/components/etc.; the terms "including" and "having" are used to indicate an open-ended inclusive meaning and mean that additional elements/components/etc. may be present in addition to the listed elements/components/etc.; the terms "first" and "second" etc. are only used as a marker, not to limit the number of the objects.

The present disclosure provides a flexible battery. Referring to FIG. 1, the flexible battery includes a plurality of battery cells 100 spaced along a first direction H1, and a flexible encapsulation structure FES cladding each battery cell 100.

Figure 2:
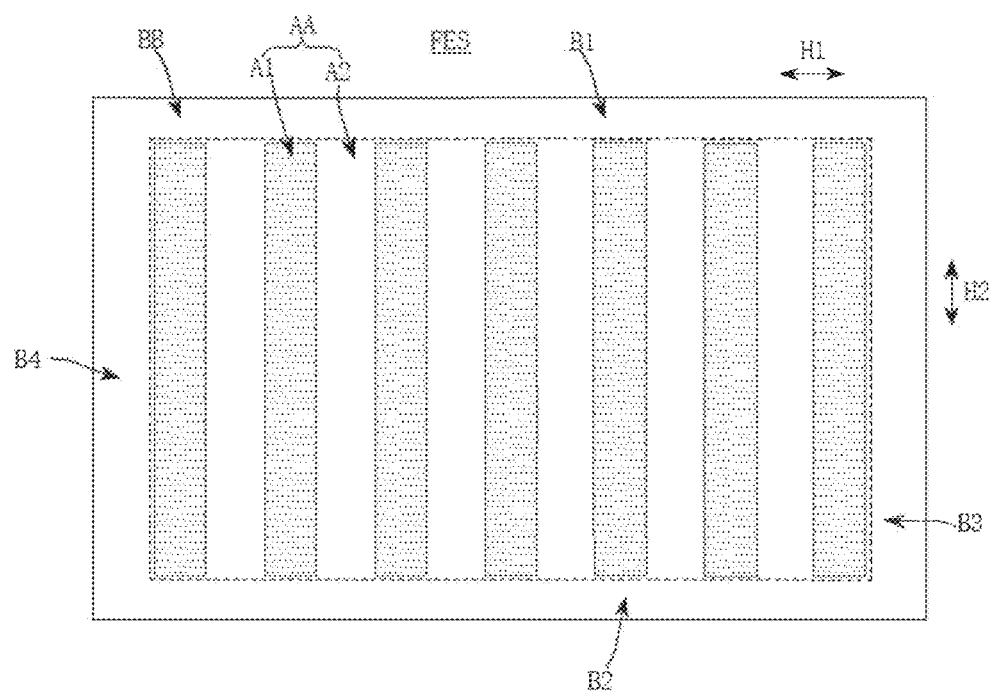
FIG. 2 is a schematic top view of a flexible encapsulation structure in an embodiment of the disclosure.

Referring to FIG. 1 and FIG. 2, on the flexible encapsulation structure FES, the area corresponding to the battery cell 100 is the rigid area A1. That is, the area overlapping with the battery cell 100 is the rigid area A1. The area between the battery cells 100 is the bending area A2. Each bending area A2 and each rigid area A1 constitute the battery area AA in which the battery cells 100 are distributed. The flexible encapsulation structure FES may further include a peripheral area BB surrounding the battery area AA, in order to achieve more efficient encapsulation of respective battery cells 100. In other words, in the flexible battery of the present disclosure, the flexible encapsulation structure FES has a battery area AA and a peripheral area BB surrounding the battery area AA. The battery area AA includes a plurality of rigid areas A1 and a plurality of bending area A2 arranged alternately along the first direction H1. Referring to FIG. 2, two ends of the battery area AA are rigid areas A1. Each battery cell 100 is disposed in a one-to-one correspondence with each rigid area A1. The battery cell 100 is disposed in the corresponding rigid area A1, and is cladded in the flexible encapsulation structure FES. In this way, in the flexible battery of the present disclosure, the battery cell 100 is disposed in the rigid area A1 and cladded in the flexible encapsulation structure FES, and the flexible battery can be bent in the bending area A2, which enables the flexible battery of the present disclosure to be bent between adjacent battery cells 100, so that the flexible battery can achieve flexible shapes such as bending, folding, or twisting.

Optionally, referring to FIG. 1, the flexible encapsulation structure FES includes a first flexible encapsulation layer F100 and a second flexible encapsulation layer F200 arranged in layers. The battery cell 100 is disposed between the first flexible encapsulation layer F100 and the second flexible encapsulation layer F200. In the rigid area A1, the first flexible encapsulation layer F100 and the second flexible encapsulation layer F200 are both connected to the battery cell 100 and isolated by the battery cell 100. In the peripheral area BB and the bending area A2, the first flexible encapsulation layer F100 and the second flexible encapsulation layer F200 are directly connected to close the rigid area A1. Further, inner surfaces of the first flexible encapsulation layer F100 and the second flexible encapsulation layer F200 are both provided with a heat sealing layer. In this way, in the rigid area A1, both the first flexible encapsulation layer F100 and the second flexible encapsulation layer F200 are adhered to the battery cell 100 to realize the fixing of the battery cell 100. In the peripheral area BB and the bending area A2, the first flexible encapsulation layer F100 and the second flexible encapsulation layer F200 are adhered to each other to implement the encapsulation of the battery cell 100.

In some embodiments, referring to FIG. 1, the first flexible encapsulation layer F100 may be a flat encapsulation layer, and the second flexible encapsulation layer F200 may be a concave-convex encapsulation layer. In this way, the flexible battery has a flat side and a punched side arranged oppositely. The encapsulation layer of the flexible encapsulation structure FES on the flat side is the first flexible encapsulation layer F100, and the encapsulation layer of the flexible encapsulation structure FES on the punched side is the second flexible encapsulation layer F200. When the flexible battery is in a flat state, the first flexible encapsulation layer F100 (flat encapsulation layer) may be flattened into a flat surface, and each battery cell 100 is located on one side of the flat surface. In other words, in the flat state, the portion of the first flexible encapsulation layer F100 in the bending area A2 may not be bent toward the gap between the battery cells 100. The second flexible encapsulation layer F200 (concave-convex encapsulation layer) may include protruding portions F301 covering the battery cells 100 and recessed portions F302 between adjacent battery cells 100. In other words, the topography of the second flexible encapsulation layer F200 may fluctuate along with the battery cell 100. In the rigid area A1, the second flexible encapsulation layer F200 covers the surface (the surface close to or away from the first flexible encapsulation layer F100) of the battery cell 100 and protrudes from the surface of the first flexible encapsulation layer F100, and this part is the protruding portions F301 of the second flexible encapsulation layer F200. In the bending area A2, the second flexible encapsulation layer F200 is between adjacent battery cells 100 and directly covers on the surface of the first flexible encapsulation layer F100, thus serving as the recessed portion F302 of the second flexible encapsulation layer F200. Further, referring to FIG. 1, the protruding portion F301 of the second flexible encapsulation layer F200 also covers the side surfaces (i.e., surfaces where the battery cells are close to or away from each other) of the battery cells. In a further solution, the protruding portion F301 of the second flexible encapsulation layer F200 also covers end surfaces of the battery cell. The end surfaces are surfaces at two ends in the length direction of the battery cell.

In other embodiments of the present disclosure, both the first flexible encapsulation layer F100 and the second flexible encapsulation layer F200 may also be concave-convex encapsulation layers.

Figure 4:
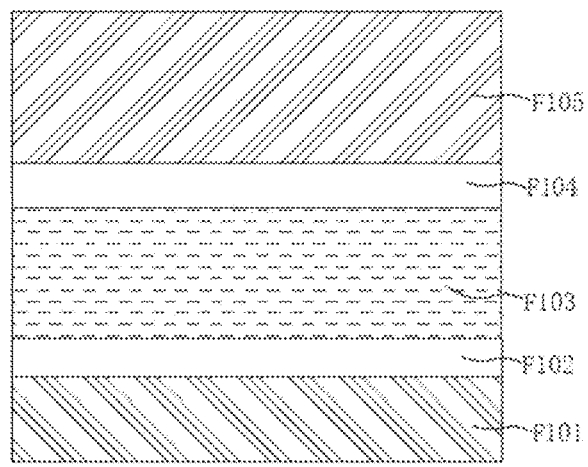
FIG. 4 is a schematic cross-sectional structural diagram of a first flexible encapsulation layer in an embodiment of the disclosure.

Optionally, referring to FIG. 4, along the direction away from the battery cell 100, the first flexible encapsulation layer F100 includes a first heat sealing layer F101, a first metal layer F103 and a first protective layer F105 which are stacked in sequence. The first heat sealing layer F101 is used for fixing the first metal layer F103 and is used for heat sealing encapsulation. The first metal layer F103 is used for isolating water and oxygen. The first protective layer F105 is used for providing protection to the first flexible encapsulation layer F100.

Further, a first adhesive layer F102 is provided between the first heat sealing layer F101 and the first metal layer F103, and a second adhesive layer F104 is provided between the first metal layer F103 and the first protective layer F105. In this way, the first heat sealing layer F101, the first metal layer F103 and the first protective layer F105 are connected by two adhesive layers. Further, materials of the first adhesive layer F102 and the second adhesive layer F104 may be different. In other embodiments of the present disclosure, materials of the first adhesive layer F102 and the second adhesive layer F104 may also be the same.

In one embodiment of the present disclosure, the first heat sealing layer F101 may be a polypropylene layer, especially a cast polypropylene layer.

In one embodiment of the present disclosure, the material of the first adhesive layer F102 may be modified polypropylene.

In an embodiment of the present disclosure, the material of the second adhesive layer F104 may be polyester or polyurethane.

In one embodiment of the present disclosure, the first protective layer F105 may be a nylon layer.

Optionally, the thickness of the first flexible encapsulation layer F100 may be in the range of 40-150 microns, for example, in the range of 80-120 microns, and for another example, in the range of 45-55 microns.

Figure 5:
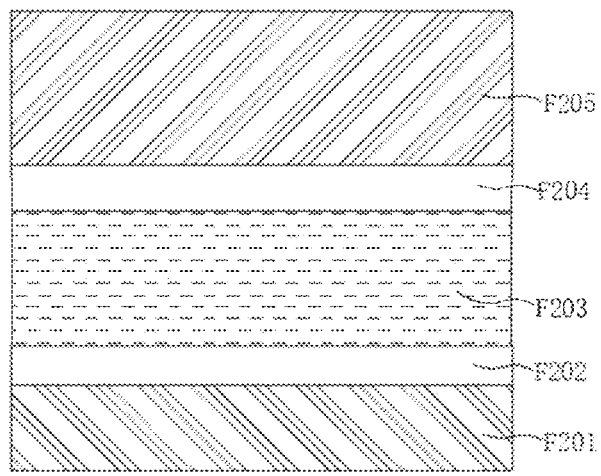
FIG. 5 is a schematic cross-sectional structural diagram of a second flexible encapsulation layer in an embodiment of the disclosure.

Optionally, referring to FIG. 5, along the direction away from the battery cell 100, the second flexible encapsulation layer F200 includes a second heat sealing layer F201, a second metal layer F203 and a second protective layer F205 which are stacked in sequence. The second heat sealing layer F201 is used for fixing the second metal layer F203 and is used for heat sealing encapsulation. The second metal layer F203 is used for isolating water and oxygen. The second protective layer F205 is used for providing protection to the second flexible encapsulation layer F200.

Further, a third adhesive layer F202 is provided between the second heat sealing layer F201 and the second metal layer F203, and a fourth adhesive layer F204 is provided between the second metal layer F203 and the second protective layer F205. In this way, the second heat sealing layer F201, the second metal layer F203 and the second protective layer F205 are connected by two adhesive layers. Further, materials of the third adhesive layer F202 and the fourth adhesive layer F204 may be different. In other embodiments of the present disclosure, materials of the third adhesive layer F202 and the fourth adhesive layer F204 may also be the same.

In one embodiment of the present disclosure, the second heat sealing layer F201 may be a polypropylene layer, especially a cast polypropylene layer.

In one embodiment of the present disclosure, the material of the third adhesive layer F202 may be modified polypropylene.

In an embodiment of the present disclosure, the material of the fourth adhesive layer F204 may be polyester or polyurethane.

In one embodiment of the present disclosure, the second protective layer F205 may be a nylon layer.

Optionally, the thickness of the second flexible encapsulation layer F200 may be in the range of 40-150 microns, for example, in the range of 80-120 microns, and for another example, in the range of 45-55 microns.

Figure 3:
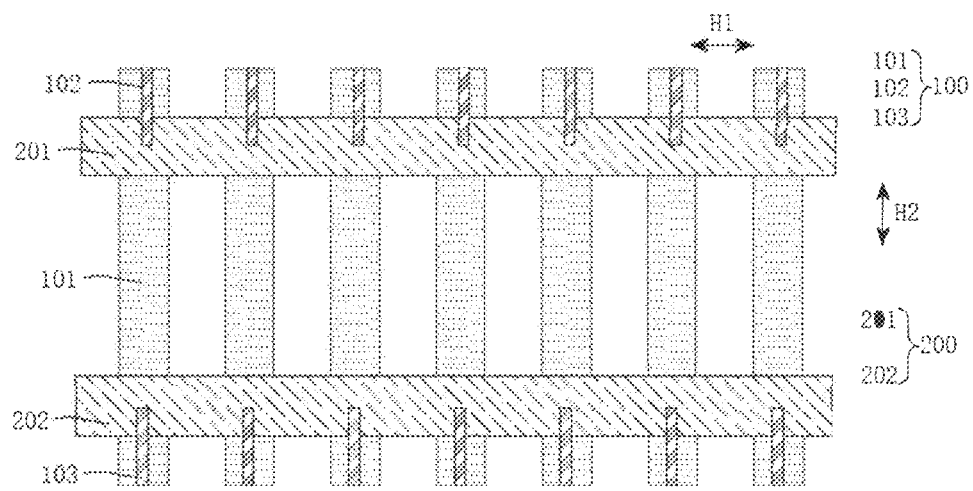
FIG. 3 is a schematic top view of each battery cell in an embodiment of the disclosure.

Optionally, referring to FIG. 3, the battery cell 100 includes a battery cell body 101 and a positive electrode tab 102 and a negative electrode tab 103 located at two ends of the battery cell body 101. The plurality of battery cell bodies 101 are arranged in sequence along the first direction H1, and there is a preset gap between two adjacent battery cells 100.

Optionally, referring to FIG. 3 where the flexible encapsulation structure is not shown, the flexible battery may further include a flexible conductive layer 200, and the flexible conductive layer 200 is electrically connected to each battery cell 100. The portion of the flexible conductive layer 200 that is electrically connected to each battery cell 100 may be cladded in the flexible encapsulation structure. At least a portion of the flexible conductive layer 200 may extend out of the flexible encapsulation structure to be electrically connected to an external circuit (e.g., a circuit board). The flexible battery is electrically connected to an external circuit through the flexible conductive layer 200, for charging or discharging. In one embodiment of the present disclosure, the flexible conductive layer 200 is at least partially sandwiched between the first flexible encapsulation layer F100 and the second flexible encapsulation layer F200.

Optionally, as for the portion of the flexible conductive layer 200 extending out of the flexible encapsulation structure, its end (the end away from the flexible encapsulation structure) may be provided with a binding area. In the binding area, the flexible conductive layer 200 may be provided with binding pads, which may include battery pads electrically connected to the external circuit. An external circuit, such as an external flexible circuit board, can be electrically connected to the flexible conductive layer 200 through the battery pad, so as to receive the electric energy provided by the flexible battery or charge the flexible battery.

In one embodiment of the present disclosure, referring to FIG. 3, the flexible conductive layer 200 includes a first flexible conductive band 201 and a second flexible conductive band 202. The first flexible conductive band 201 is electrically connected to the positive electrode tabs 102 of each battery cell 100, so that the positive electrodes of each battery cell 100 are connected in parallel. The second flexible conductive band 202 is electrically connected to the negative electrode tabs 103 of each battery cell 100, so that the negative electrodes of each battery cell 100 are connected in parallel.

Optionally, the battery cell may be a lithium battery structure. In an embodiment of the present disclosure, the battery cell has a first diaphragm, a negative electrode sheet, a second diaphragm, a positive electrode sheet, a negative electrode tab arranged on the negative electrode sheet, and a positive electrode tab arranged on the positive electrode sheet, that are stacked in sequence. In order to increase the capacity of the battery cell, the electrode sheets (i.e., the positive electrode sheet, the negative electrode sheet) and diaphragms (the first diaphragm, the second diaphragm) of the battery cell can be wound to form a rigid energy storage unit.

Optionally, referring to FIG. 3, the positive tab 102 and the negative tab 103 can be bent to the surface (the surface close to or away from the first flexible encapsulation layer F100) of the battery cell 100, so as to be electrically connected with the flexible conductive layer 200. In an embodiment of the present disclosure, the flexible conductive layer 200 is disposed between the first flexible encapsulation layer F100 and the battery cell 100, and extends out of the flexible encapsulation structure along the first direction H1.

Optionally, in some embodiments, the distance between two adjacent battery cells (the dimension of the interval between two adjacent battery cells in the first direction) is not less than the thickness of the battery cell (the dimension between upper and lower surfaces of the battery cell). In this way, the flexible battery can maintain great flexibility. In other embodiments of the present disclosure, the distance between two adjacent battery cells may also be smaller than the thickness of the battery cell.

In the related art, when the flexible battery is bent, the problem of stress concentration easily occurs in the peripheral area BB. Specifically, at the intersection of the extension line of the bending area A2 and the peripheral area BB, stress concentration is likely to occur, thereby causing the flexible encapsulation structure FES to generate micro-cracks at this position. The micro-cracks may lead to failure problems such as liquid leakage and bulging of the flexible battery, and may cause safety hazards.

In the related art, due to the small size of the micro-cracks, the micro-crack defects are often difficult to detect, especially, cannot be quickly observed by naked eyes. This will lead to certain safety hazards of the flexible battery.

Figure 6:
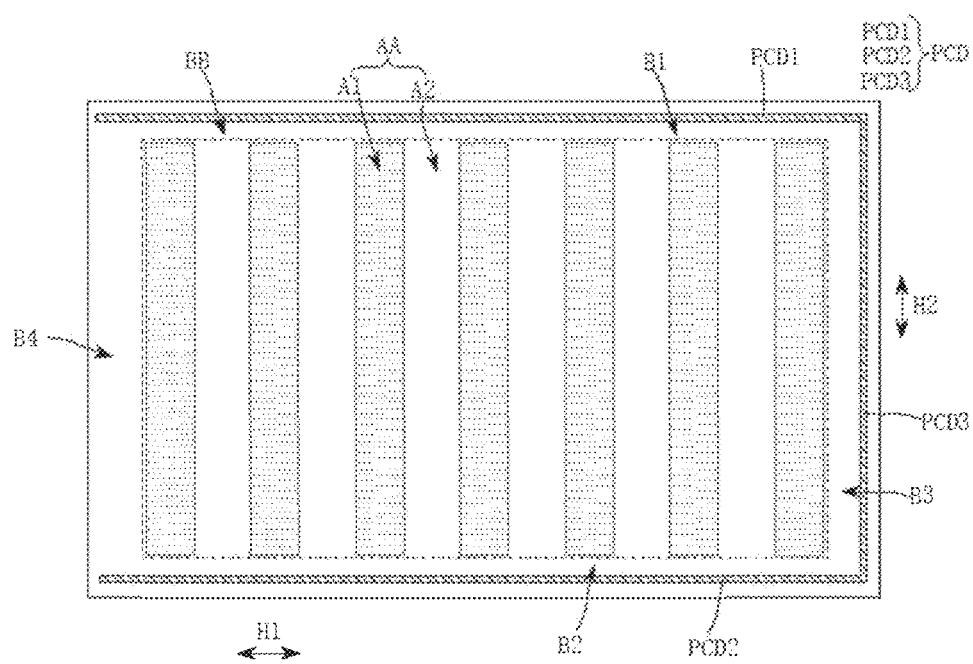
FIG. 6 is a schematic diagram of positions of crack detection wirings in an embodiment of the present disclosure.

In some embodiments of the present disclosure, referring to FIG. 6, in order to efficiently detect micro-cracks at the edge of the flexible encapsulation structure FES, the flexible battery may be provided with a crack detection wiring PCD. The crack detection wiring PCD may be located in the peripheral area BB and at least partially extends along the first direction H1. The crack detection wiring PCD is cladded in the flexible encapsulation structure FES. In this embodiment, when a micro-crack occurs at the position of the crack detection wiring PCD of the flexible encapsulation structure FES, the micro-crack will damage the crack detection wiring PCD. For example, the resistance of the crack detection wiring PCD at the micro-crack will increase due to local break or thinning, or the crack detection wiring PCD at the micro-crack will break. Therefore, it may determine whether there is a micro-crack by detecting the electrical state of the crack detection wiring PCD, for example, through the value of the resistance or whether the circuit is disconnected.

In these embodiments, the crack detection wiring PCD is cladded and protected by the flexible encapsulation structure FES. In this way, the electrical state of the crack detection wiring PCD is consistent with the state of the flexible encapsulation structure FES in the peripheral area BB, which improves the accuracy of crack detection. In the embodiment of the present disclosure, it avoids disposing the crack detection wiring PCD outside the flexible encapsulation structure FES. If the crack detection wiring PCD is arranged outside the flexible encapsulation structure FES, when the crack detection wiring PCD is broken due to non-micro-crack factors, for example, when the crack detection wiring PCD is corroded or scratched, the electrical state change of the crack detection wiring PCD is not consistent with the state of the flexible encapsulation structure FES, which is not conducive to the accurate detection of micro-cracks in the flexible encapsulation structure FES.

Figure 7:
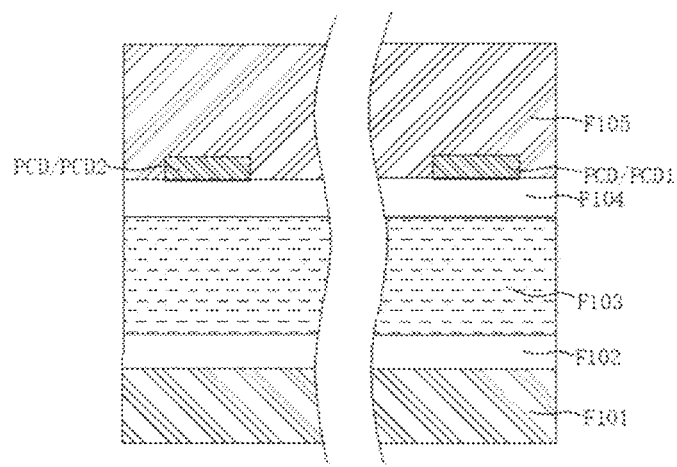
FIG. 7 is a schematic cross-sectional structural diagram of a first flexible encapsulation layer in an embodiment of the present disclosure.

Optionally, referring to FIG. 7, the crack detection wiring PCD may be located in the first flexible encapsulation layer F100. In this way, the first flexible encapsulation layer F100 can provide protection for the crack detection wiring PCD, so as to prevent the crack detection wiring PCD from being exposed and then scratched or corroded.

In one embodiment of the present disclosure, the crack detection wiring PCD may be located between the second adhesive layer F104 and the first protective layer F105. In this way, the crack detection wiring PCD can be protected by the first protective layer F105, and is insulated from the first metal layer F103 by the second adhesive layer F104. Not only this, a film layer such as the first metal layer F103 is arranged between the crack detection wiring PCD and the first heat sealing layer F101, which avoids the influence of melting deformation of the first heat sealing layer F101 during heat sealing on the crack detection wiring PCD.

Figure 8:
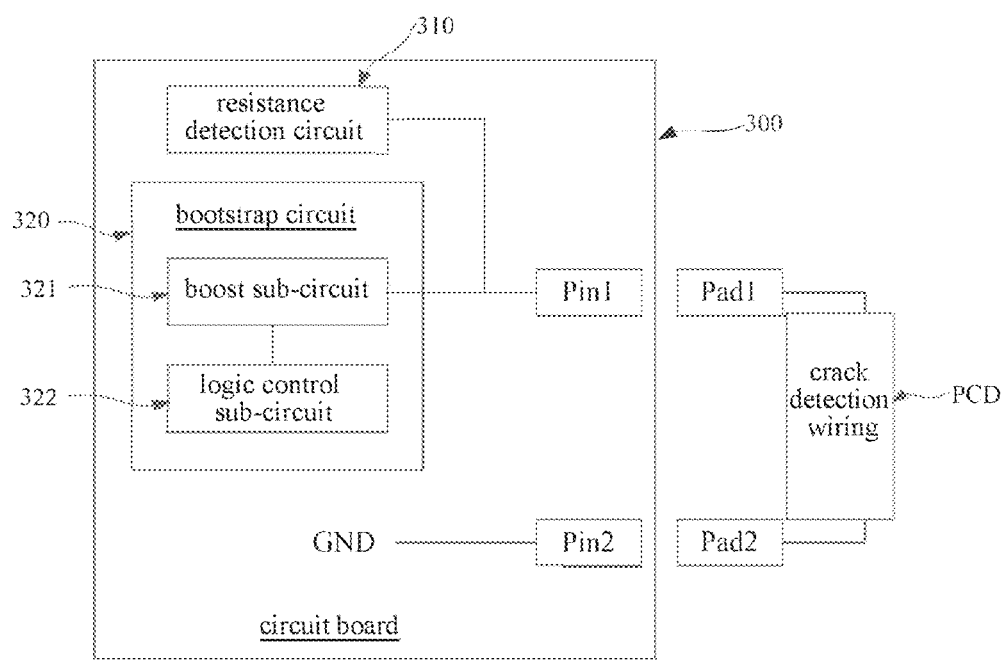
FIG. 8 is a schematic diagram of the structure of the circuit board and the crack detection wiring in an embodiment of the present disclosure. For the sake of clarity of illustration, the crack detection pins and the crack detection pads are shown staggered and not overlapped in FIG. 8.

In some embodiments, referring to FIG. 8, ends of the crack detection wiring PCD may be electrically connected with crack detection pads (Pad1, Pad2). The crack detection pads (Pad1, Pad2) are used to electrically connected with the external circuit (e.g., the circuit board 300), so that the external circuit detects whether the crack detection wiring PCD is disconnected or damaged. In one embodiment of the present disclosure, the crack detection pads (Pad1, Pad2) may be directly connected to the ends of the crack detection wiring PCD. In other embodiments of the present disclosure, the crack detection pad may also not be directly connected with the crack detection wiring, but may be transferred through other conductive wirings. That is, the crack detection pad and the crack detection wiring can be indirectly connected through other conductive wirings.

In some embodiments, the crack detection wiring PCD may converge toward the side of the flexible conductive layer 200 and extend toward the binding area. The crack detection pad may be disposed in the binding area. In this way, the flexible battery can be brought together with externally connected pads, so as to improve the degree of integration and facilitate the connection with the external circuit. In other embodiments of the present disclosure, the crack detection pads may be disposed in the binding area, and the crack detection wirings may not converge into the binding area, but may be electrically connected to the crack detection pad through other conductive wirings connected to the binding area.

Referring to FIG. 2, the peripheral area BB may include a first peripheral area B1, a third peripheral area B3, a second peripheral area B2 and a fourth peripheral area B4 which are connected end to end in sequence. The first peripheral area B1 and the second peripheral area B2 are located at two sides of the battery area AA, and both extend along the first direction H1. The third peripheral area B3 and the fourth peripheral area B4 are located at two sides of the battery area AA, and both extend along the second direction H2. The second direction H2 is the extending direction of the battery cells 100. Further, the first direction H1 and the second direction H2 are perpendicular.

In one embodiment of the present disclosure, referring to FIG. 6, the crack detection wiring PCD includes a first sub detection wiring PCD1 and a second sub detection wiring PCD2 that are electrically connected to each other. The first sub detection wiring PCD1 penetrates through the first peripheral area B1 along the first direction H1, and the second sub detection wiring PCD2 penetrates through the second peripheral area B2 along the first direction H1. When the flexible battery is bent, the first peripheral area B1 and the second peripheral area B2 are prone to generating stress concentration and then generating micro-cracks. In this embodiment, the crack detection wiring PCD penetrates through the first peripheral area B1 and the second peripheral area B2 along the first direction H1, so that micro-cracks in the first peripheral area B1 and the second peripheral area B2 can be effectively detected.

Further, the crack detection wiring PCD further includes a third sub detection wiring PCD3 penetrating through the third peripheral area B3, and the third sub detection wiring PCD3 connects the first sub detection wiring PCD1 and the second sub detection wiring PCD2. As such, the crack detection wiring PCD can also detect micro-cracks located in the third peripheral area B3.

It can be understood that, in some embodiments, the crack detection wiring PCD may further include a fourth sub detection wiring located in the fourth peripheral area B4, so as to detect micro-cracks located in the fourth peripheral area B4.

Optionally, the number of crack detection wiring PCD may be one or more.

Optionally, the thickness of the crack detection wiring PCD is in the range of 0.3-1.5 microns. The desired crack detection wiring PCD can be formed by printing, vapor deposition, magnetron sputtering and the like.

Optionally, the material of the crack detection wiring PCD may be a metal material, which may include one metal layer or a plurality of stacked metal layers. For example, in an embodiment of the present disclosure, the crack detection wiring PCD includes a titanium layer, an aluminum layer, and a titanium layer that are stacked in sequence. In other embodiments of the present disclosure, the crack detection wiring PCD may also use other conductive materials, such as organic conductive materials or conductive metal oxides, or the like.

Optionally, the width of the crack detection wiring PCD is in the range of 0.2-1.0 mm. Further, the width of the crack detection wiring PCD is in the range of 0.4-0.7 mm. For example, the crack detection wiring PCD has a width of 0.5 mm.

Optionally, the distance between the crack detection wiring PCD and the edge of the flexible encapsulation structure FES is in the range of 0.5-1.5 mm. In this way, the crack detection wiring PCD is arranged close to the edge of the flexible encapsulation structure FES, to reflect the micro-crack situation of the edge of the flexible encapsulation structure FES in time. Further, the distance between the crack detection wiring PCD and the edge of the flexible encapsulation structure FES is in the range of 0.8-1.0 mm. For example, in an embodiment of the present disclosure, the distance between the crack detection wiring PCD and the edge of the flexible encapsulation structure FES is 0.93 mm.

The present disclosure can also provide an external circuit bound and connected with the flexible battery, for example, providing a circuit board. Referring to FIG. 8, the circuit board 300 includes a resistance detection circuit 310. The resistance detection circuit 310 is used for electrical connection with the crack detection wiring PCD of the flexible battery, and is configured to be able to detect the resistance of the crack detection wiring PCD. In this way, it can be determined whether there are micro-cracks at the edge of the flexible battery according to the resistance of the crack detection wiring PCD.

Further, the circuit board 300 may further include a bootstrap circuit 320. The bootstrap circuit 320 is used for electrical connection with the crack detection wiring PCD, and is configured to receive a first voltage and output a second voltage to the crack detection wiring. The second voltage is higher than the first voltage. In this way, the bootstrap circuit 320 can output a higher voltage signal to the crack detection wiring, to accelerate the resistance change of the crack detection wiring PCD at the micro-crack, thereby improving the sensitivity of the micro-crack detection. Specifically, when a micro-crack occurs at the edge of the flexible battery, the crack detection wiring PCD at this position will become fragile and the resistance will increase. When a high-voltage signal passes through, the heat generated by the crack detection wiring PCD at this position will be higher than other locations, which causes the crack detection wiring PCD to break at an accelerated rate at that location.

Further, the bootstrap circuit 320 may generate a high voltage pulse signal with a peak voltage of the second voltage, thereby generating a detection current on the crack detection wiring PCD or burning out the crack detection wiring PCD at the crack.

Referring to FIG. 8, the circuit board 300 may further include crack detection pins (Pin1, Pin2) bound and connected with the crack detection pads (Pad1, Pad2). In this way, the circuit board 300 can be electrically connected to the crack detection wiring PCD. Then, the resistance of the crack detection wiring PCD can be detected, and it can be determined whether micro-cracks are generated at the edge of the flexible battery according to the resistance of the crack detection wiring PCD.

Figure 9:
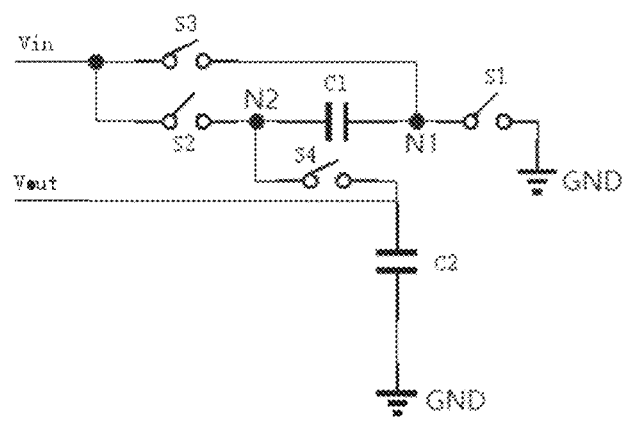
FIG. 9 is a schematic diagram of an equivalent circuit of a boost sub-circuit in an embodiment of the present disclosure.

In one embodiment of the present disclosure, the bootstrap circuit 320 includes a boost sub-circuit 321 and a logic control sub-circuit 322. Referring to FIG. 9, the boost sub-circuit 321 includes:
  a first capacitor C1, having two ends connected to a first node N1 and a second node N2 respectively;
  a first switch S1, having one end electrically connected to the first node N1, and another end used for applying a reference voltage GND;
  a second switch S2, having one end electrically connected to the second node N2, and another end connected to an input end Vin for applying the first voltage;
  a third switch S3, having one end for applying the first voltage, and another end electrically connected to the first node N1;
  a fourth switch S4, having one end connected to the second node N2, and another end connected to an output end Vout for outputting the second voltage; and
  a second capacitor C2, having one end for applying the reference voltage GND, and another end connected to the output end Vout.

The logic control sub-circuit 322 is used to control the turn-on or turn-off of the first switch S1, the second switch S2, the third switch S3 and the fourth switch S4. Specifically, the logic control sub-circuit is configured to turn on the first switch S1 and the second switch S2 and turn off the third switch S3 and the fourth switch S4 during a charging stage. The logic control sub-circuit 322 is further configured to turn off the first switch S1 and the second switch S2 and turn on the third switch S3 and the fourth switch S4 during a discharging stage.

In this embodiment, the working process of the bootstrap circuit 320 is as follows.

Figure 10:
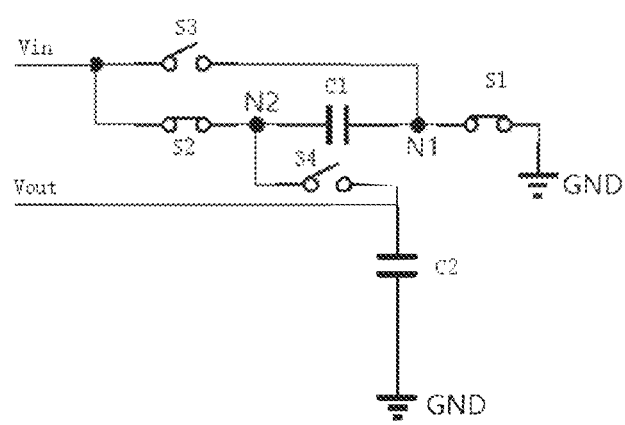
FIG. 10 is a schematic circuit diagram of a boost sub-circuit in a charging stage in an embodiment of the present disclosure.

In the charging stage, referring to FIG. 10, the input end Vin is applied with the first voltage V1. The first switch S1 and the second switch S2 are turned on, while the third switch S3 and the fourth switch S4 are turned off. At this time, at two ends of the first capacitor C1, the voltage of the first node N1 is 0V, and the voltage of the second node N2 is the first voltage V1. The potential difference between the second node N2 and the first node N1 is equal to the first voltage V1.

Figure 11:
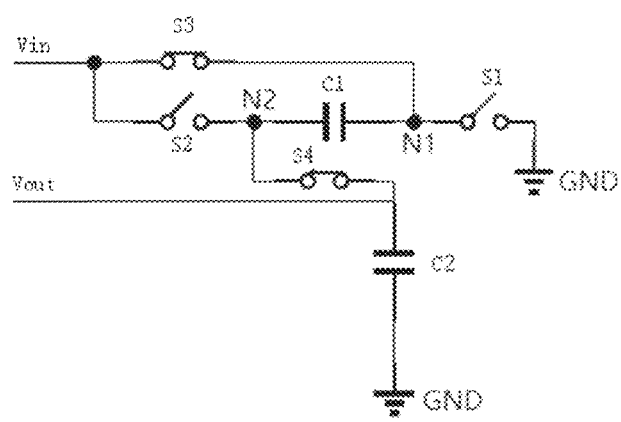
FIG. 11 is a schematic circuit diagram of a boost sub-circuit in a discharging stage in an embodiment of the present disclosure.

In the discharging stage, referring to FIG. 11, the input terminal Vin is applied with the first voltage V1. The first switch S1 and the second switch S2 are turned off, while the third switch S3 and the fourth switch S4 are turned on. At this time, the voltage of the first node N1 is equal to the first voltage V1, and the voltage of the second node N2 is bootstrapped to 2V1 under the coupling action of the first capacitor C1. The voltage of the second node N2 is output through the output end Vout as an output voltage. At this time, the voltage output by the output end Vout is the second voltage, and its magnitude is 2V1.

In some embodiments of the present disclosure, the risk of generating micro-cracks can be lowered by adjusting the flexible encapsulation structure FES. Referring to FIG. 1, the first flexible encapsulation layer F100 may be a flat encapsulation layer. The second flexible encapsulation layer F200 may be a concave-convex encapsulation layer, which may include a protruding portion F301 covering the battery cell 100 and a recessed portion F302 between adjacent battery cells 100. In this way, the flexible battery can be bent toward the concave-convex side. The elastic modulus of the first flexible encapsulation layer F100 may be greater than that of the second flexible encapsulation layer F200. In this way, by making the elastic modulus of the flat encapsulation layer larger, the neutral plane of the flexible encapsulation structure FES during bending can be adjusted, so that the neutral plane is closer to the outer surface of the first flexible encapsulation layer F100 with a larger elastic modulus. In this way, when bending, most of the flexible encapsulation structure FES is located on the side of the neutral layer close to the battery cell 100 and is subjected to compressive stress, and a small part of the flexible encapsulation structure FES is located on the side of the neutral layer away from the battery cell 100 and is subjected to tensile stress. For the part of the flexible encapsulation structure FES that is subjected to tensile stress, due to the offset of the neutral plane, the thickness of the part is small, so its tensile deformation is small. On the whole, the flexible encapsulation structure FES has a stronger resistance to bending, and is less likely to generate micro-cracks due to bending. This improves the bending resistance of the flexible battery.

The present disclosure conducts bending reliability tests (50,000 times of bending) on three different flexible batteries.

In the first type of flexible battery, the first flexible encapsulation layer F100 adopts a flexible encapsulation layer with a high elastic modulus, and the second flexible encapsulation layer F200 also adopts a flexible encapsulation layer with a high elastic modulus. The results show that the flexible encapsulation structure FES of the first type of flexible battery produces creases at the bending position. This shows that the first type of flexible battery is damaged at the edge and cannot pass the bending reliability test.

In the second type of flexible battery, the first flexible encapsulation layer F100 adopts a flexible encapsulation layer with a low elastic modulus, and the second flexible encapsulation layer F200 also adopts a flexible encapsulation layer with a low elastic modulus. The results show that the flexible encapsulation structure FES of the second type of flexible battery produces creases at the bending position. This shows that the second type of flexible battery is damaged at the edge and cannot pass the bending reliability test.

In the third type of flexible battery, the first flexible encapsulation layer F100 adopts a flexible encapsulation layer with a high elastic modulus, and the second flexible encapsulation layer F200 adopts a flexible encapsulation layer with a low elastic modulus. The results show that no creases are generated at the edge of the third type of flexible battery. This indicates that the flexible battery of the embodiment of the present disclosure passes the bending reliability test, with a low risk of generating micro-cracks.

Optionally, the elastic modulus of the first metal layer may be greater than that of the second metal layer, so that the elastic modulus of the first flexible encapsulation layer F100 is greater than that of the second flexible encapsulation layer F200.

Optionally, the elastic modulus of the first flexible encapsulation layer F100 is 6-11 times of the elastic modulus of the second flexible encapsulation layer F200. In this way, the neutral plane of the flexible encapsulation structure FES can be effectively adjusted, thereby improving the bending reliability of the flexible battery.

In an embodiment of the present disclosure, the elastic modulus of the first flexible encapsulation layer F100 is in the range of 180 GPa to 220 GPa. Further, the first flexible encapsulation layer F100 is a steel-plastic film. For example, the first metal layer F103 may be a stainless steel layer, such as 304 stainless steel. It can be understood that, the first flexible encapsulation layer F100 can also be other flexible encapsulation layers with a high elastic modulus.

In one embodiment of the present disclosure, the Poisson ratio of the first flexible encapsulation layer F100 may be between 0.35 and 0.45, for example, between 0.39 and 0.41.

In one embodiment of the present disclosure, the thickness of the first flexible encapsulation layer F100 may be between 40 and 60 microns, for example, between 45 and 55 microns.

In one embodiment of the present disclosure, the elastic modulus of the second flexible encapsulation layer F200 is in the range of 20 GPa to 30 GPa. Further, the second flexible encapsulation layer F200 is an aluminum-plastic film. For example, the second metal layer F203 may be an aluminum foil layer. It can be understood that, the second flexible encapsulation layer F200 can also be other flexible encapsulation layers with a low elastic modulus.

In one embodiment of the present disclosure, the Poisson ratio of the second flexible encapsulation layer F200 may be between 0.35 and 0.45, for example, between 0.39 and 0.41.

In one embodiment of the present disclosure, the thickness of the second flexible encapsulation layer F200 may be between 40 and 60 microns, for example, between 45 and 55 microns.

The embodiments of the present disclosure also provide an electronic device. The electronic device includes any one of the flexible batteries described in the above-mentioned flexible battery embodiments. The electronic device may be a smart watch, a smart phone or other types of electronic devices. In particular, the electronic device may be a flexible portable electronic device, such as a flexible wearable device. Since the electronic device has any one of the flexible batteries described in the above-mentioned flexible battery embodiments, it has the same beneficial effects, and details are not described herein.

In an embodiment of the present disclosure, the electronic device further includes a display panel, and the flexible battery is used to supply power to the display panel.

In a further embodiment, the display panel is a flexible display panel. In this way, the electronic device adopts a flexible battery and a flexible display panel, so that the electronic device can be bent as a whole.

Other embodiments of the present disclosure will readily occur to those skilled in the art upon consideration of the specification and practice of the disclosure disclosed herein. This disclosure is intended to cover any variations, uses, or adaptations of this disclosure that follow the general principles of this disclosure and include common general knowledge or conventional technical means in the technical field not disclosed by this disclosure. The specification and embodiments are to be regarded as exemplary only, with the true scope and spirit of the disclosure being indicated by the appended claims.

What is claimed is:
1. A flexible battery, comprising:
a flexible encapsulation structure, having a battery area and a peripheral area surrounding the battery area, wherein the battery area comprises a plurality of rigid areas and a plurality of bending areas alternately arranged along a first direction,
a plurality of battery cells, arranged in a one-to-one correspondence with the plurality of rigid areas, wherein, in a corresponding rigid area, the battery cell is cladded in the flexible encapsulation structure; and
a crack detection wiring, located in the peripheral area and at least partially extending along the first direction, wherein, the crack detection wiring is cladded in the flexible encapsulation structure, wherein the flexible battery further comprises a flexible conductive layer, the flexible conductive layer is at least partially cladded in the flexible encapsulation structure, and is electrically connected with each battery cell; and the flexible conductive layer has a binding area outside the flexible encapsulation structure, the binding area has a crack detection pad electrically connected with the crack detection wiring.

2. The flexible battery according to claim 1, wherein the peripheral area comprises a first peripheral area and a second peripheral area located at two sides of the battery area, both the first peripheral area and the second peripheral area extend along the first direction;

the crack detection wiring comprises a first sub detection wiring and a second sub detection wiring that are electrically connected to each other, the first sub detection wiring penetrates through the first peripheral area along the first direction, and the second sub detection wiring penetrates through the second peripheral area along the first direction.

3. The flexible battery according to claim 1, wherein a thickness of the crack detection wiring is in a range of 0.3-1.5 microns.

4. The flexible battery according to claim 1, wherein a width of the crack detection wiring is in a range of 0.2-1.0 mm.

5. The flexible battery according to claim 1, wherein a distance between the crack detection wiring and an edge of the flexible encapsulation structure is in a range of 0.5-1.5 mm.

6. The flexible battery according to claim 1, wherein a material of the crack detection wiring is a metal material.

7. The flexible battery according to claim 1, wherein the flexible encapsulation structure comprises a first flexible encapsulation layer and a second flexible encapsulation layer arranged in layers, the battery cells are arranged between the first flexible encapsulation layer and the second flexible encapsulation layer;

the crack detection wiring is located in the first flexible encapsulation layer.

8. The flexible battery according to claim 2, wherein the peripheral area further comprises a third peripheral area, the third peripheral area connects the first peripheral area and the second peripheral area;

the crack detection wiring further comprises a third sub detection wiring penetrating through the third peripheral area, and the third sub detection wiring connects the first sub detection wiring and the second sub detection wiring.

9. The flexible battery according to claim 2, wherein the flexible encapsulation structure comprises a first flexible encapsulation layer and a second flexible encapsulation layer arranged in layers, the battery cells are arranged between the first flexible encapsulation layer and the second flexible encapsulation layer;

the crack detection wiring is located in the first flexible encapsulation layer.

10. The flexible battery according to claim 7, wherein the battery cells are arranged on a side of the first flexible encapsulation layer and arranged at intervals along the first direction;

the second flexible encapsulation layer comprises a protruding portion covering the battery cell, and a recessed portion between adjacent battery cells.

11. The flexible battery according to claim 7, wherein an elastic modulus of the first flexible encapsulation layer is greater than an elastic modulus of the second flexible encapsulation layer.

12. The flexible battery according to claim 7, wherein the first flexible encapsulation layer is a steel-plastic film.

13. The flexible battery according to claim 7, wherein the second flexible encapsulation layer is an aluminum-plastic film.

14. The flexible battery according to claim 7, wherein, along a direction away from the battery cell, the first flexible encapsulation layer comprises a first heat sealing layer, a first adhesive layer, a first metal layer, a second adhesive layer and a first protective layer that are stacked in sequence;

the crack detection wiring is sandwiched between the second adhesive layer and the first protective layer.

15. A circuit board, comprising:

a resistance detection circuit, electrically connected with a crack detection wiring of a flexible battery, and configured to be able to detect a resistance of the crack detection wiring, wherein the flexible battery comprises: a flexible encapsulation structure, having a battery area and a peripheral area surrounding the battery area, wherein the battery area comprises a plurality of rigid areas and a plurality of bending areas alternately arranged along a first direction; a plurality of battery cells, arranged in a one-to-one correspondence with the plurality of rigid areas, wherein, in a corresponding rigid area, the battery cell is cladded in the flexible encapsulation structure; and the crack detection wiring, located in the peripheral area and at least partially extending along the first direction, wherein, the crack detection wiring is cladded in the flexible encapsulation structure; and a bootstrap circuit, electrically connected with the crack detection wiring, and configured to receive a first voltage and output a second voltage to the crack detection wiring, wherein the second voltage is higher than the first voltage.

16. The circuit board according to claim 15, wherein the bootstrap circuit comprises a boost sub-circuit and a logic control sub-circuit, the boost sub-circuit comprises:

a first capacitor, having two ends connected to a first node and a second node respectively;

a first switch, having one end electrically connected to the first node, and another end used for applying a reference voltage;

a second switch, having one end electrically connected to the second node, and another end electrically connected to an input end;

a third switch, having one end electrically connected to the input end, and another end electrically connected to the first node;

a fourth switch, having one end electrically connected to the second node, and another end electrically connected to an output end; and a second capacitor, having one end electrically connected to the output end, and another end used for applying the reference voltage, wherein the logic control sub-circuit is configured to turn on the first switch and the second switch and turn off the third switch and the fourth switch during a charging stage, and the logic control sub-circuit is further configured to turn off the first switch and the second switch and turn on the third switch and the fourth switch during a discharging stage.

17. The circuit board according to claim 15, wherein the peripheral area comprises a first peripheral area and a second peripheral area located at two sides of the battery area, both the first peripheral area and the second peripheral area extend along the first direction;

the crack detection wiring comprises a first sub detection wiring and a second sub detection wiring that are electrically connected to each other, the first sub detection wiring penetrates through the first peripheral area along the first direction, and the second sub detection wiring penetrates through the second peripheral area along the first direction.

18. An electronic device comprising a flexible battery, wherein the flexible battery comprises:

a flexible encapsulation structure, having a battery area and a peripheral area surrounding the battery area, wherein the battery area comprises a plurality of rigid areas and a plurality of bending areas alternately arranged along a first direction;

a plurality of battery cells, arranged in a one-to-one correspondence with the plurality of rigid areas, wherein, in a corresponding rigid area, the battery cell is cladded in the flexible encapsulation structure; and a crack detection wiring, located in the peripheral area and at least partially extending along the first direction, wherein, the crack detection wiring is cladded in the flexible encapsulation structure, wherein the flexible battery further comprises a flexible conductive layer, the flexible conductive layer is at least partially cladded in the flexible encapsulation structure, and is electrically connected with each battery cell; and the flexible conductive layer has a binding area outside the flexible encapsulation structure, the binding area has a crack detection pad electrically connected with the crack detection wiring.

\* \* \* \* \*